United States Patent
Hook et al.

(10) Patent No.: US 9,171,952 B2
(45) Date of Patent: Oct. 27, 2015

(54) LOW GATE-TO-DRAIN CAPACITANCE FULLY MERGED FINFET

(71) Applicant: INTERNATIONAL BUSINESS MACHINES CORPORATION, Armonk, NY (US)

(72) Inventors: Terence B. Hook, Jericho, VT (US); Edward J. Nowak, Essex Junction, VT (US)

(73) Assignee: GLOBALFOUNDRIES U.S. 2 LLC, Hopewell Junction, NY (US)

(*) Notice: Subject to any disclaimer, the term of this patent is extended or adjusted under 35 U.S.C. 154(b) by 34 days.

(21) Appl. No.: 13/905,661

(22) Filed: May 30, 2013

(65) Prior Publication Data

US 2014/0353730 A1    Dec. 4, 2014

(51) Int. Cl.
*H01L 29/78* (2006.01)
*H01L 21/02* (2006.01)
*H01L 29/66* (2006.01)

(52) U.S. Cl.
CPC ........ *H01L 29/785* (2013.01); *H01L 29/66545* (2013.01)

(58) Field of Classification Search
CPC ....... H01L 29/78; H01L 21/02; H01L 29/785; H01L 21/02293
USPC .......................................... 257/288; 438/478
See application file for complete search history.

(56) References Cited

U.S. PATENT DOCUMENTS

| | | | |
|---|---|---|---|
| 7,132,342 B1 * | 11/2006 | Sadovnikov et al. | 438/303 |
| 7,456,471 B2 | 11/2008 | Anderson et al. | |
| 7,692,254 B2 | 4/2010 | Anderson et al. | |
| 7,851,865 B2 | 12/2010 | Anderson et al. | |
| 7,879,677 B2 | 2/2011 | Lee | |
| 8,043,920 B2 | 10/2011 | Chan et al. | |
| 2005/0242395 A1 * | 11/2005 | Chen et al. | 257/347 |
| 2006/0154423 A1 * | 7/2006 | Fried et al. | 438/283 |
| 2007/0287256 A1 | 12/2007 | Chang et al. | |
| 2011/0037104 A1 * | 2/2011 | Anderson et al. | 257/263 |
| 2011/0049583 A1 | 3/2011 | Lin et al. | |
| 2011/0068407 A1 | 3/2011 | Yeh et al. | |
| 2011/0101455 A1 | 5/2011 | Basker et al. | |
| 2012/0068264 A1 | 3/2012 | Cheng et al. | |
| 2012/0104472 A1 | 5/2012 | Xu et al. | |
| 2012/0211808 A1 | 8/2012 | Wei et al. | |

* cited by examiner

*Primary Examiner* — Asok K Sarkar
*Assistant Examiner* — Dmitriy Yemelyanov
(74) *Attorney, Agent, or Firm* — Michael LeStrange; Roberts Mlotkowski Safran & Cole, P.C.

(57) ABSTRACT

A low gate-to-drain capacitance merged finFET and methods of manufacture are disclosed. The method includes forming a plurality of fins on a substrate. The method further includes forming at least one dummy gate structure intersecting the plurality of fins. The method further includes forming a gap between sidewalls of the fins and an insulator material, which exposes portions of the substrate. The method further includes merging the fins together with semiconductor material formed within the gaps and over the insulator material.

19 Claims, 6 Drawing Sheets

LOW GATE-TO-DRAIN CAPACITANCE FULLY MERGED FINFET

FIELD OF THE INVENTION

The invention relates to semiconductor structures and, more particularly, to a low gate-to-drain capacitance merged finFET and methods of manufacture.

BACKGROUND

As integrated circuits continue to scale downward in size, the finFET (fin field effect transistor) is becoming an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions.

Given the control of the conducting channel by the gate, which "wraps" around the channel, very little current is allowed to leak through the body when the device is in the off state. This allows the use of lower threshold voltages, which results in optimal switching speeds and power. However, the 3D nature of finFETs and the multiple fins making up the transistors introduce a large number of new parasitic resistance and capacitances to be considered. Accordingly, there exists a need in the art to overcome the deficiencies and limitations described hereinabove.

SUMMARY

In an aspect of the invention, a method comprises forming a plurality of fins on a substrate. The method further comprises forming at least one dummy gate structure intersecting the plurality of fins. The method further comprises forming a gap between sidewalls of the fins and an insulator material, which exposes portions of the substrate. The method further comprises merging the fins together with semiconductor material formed within the gaps and over the insulator material.

In an aspect of the invention, a method comprises forming a plurality of fins on a substrate. The method further comprises forming at least one dummy gate structure intersecting the plurality of fins. The at least one dummy gate structure comprises a first material and a second material, which forms an overhang over the first material. The method further comprises forming sidewall material on sides of the plurality of fins and under the overhang. The method further comprises forming a dielectric material on exposed portions of the substrate and adjacent to the sidewall material on sides of the plurality of fins. The method further comprises removing the sidewall material on sides of the plurality of fins to form a gap between each of the plurality of fins and portions of the dielectric material. The method further comprises merging the fins together with semiconductor material formed within the gaps.

In an additional aspect of the invention, a device comprises: a plurality of parallel fins; a gate stack intersecting the plurality of fins; and a conducting semiconductor strap surrounding at least three sides of a portion of the plurality of fins, bridging an upper portions of the fins, and interrupted between the plurality of fins in a lower region by an insulating region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a low gate-to-drain capacitance merged finFET and methods of manufacture. More specifically, the structure of the present invention includes N-type and P-type finFETs, with a merged region between the gate structures. In embodiments, the merged region is an epitaxially grown material which is grown on an underlying substrate formed by a gap between a dielectric material, for example, and sidewalls of fins forming the N-type and P-type finFETs. Advantageously, the processes of the present invention provide a low capacitance FET by using the dielectric material deposited on an underlying substrate, prior to epitaxially growing of the source and drain regions adjacent to the fin structures.

In embodiments, the low-capacitance FET comprises a plurality of parallel fins, a gate stack intersecting the fins, and a conducting semiconductor strap surrounding at least three sides of a portion of the fins. In embodiments, the strap bridges an upper portion of the fins, and the strap is interrupted between fins in a lower region by an insulating region, i.e., dielectric material. In a method of manufacturing the low-capacitance FET, a plurality of parallel fins are formed on a substrate and a gate structure is formed intersecting the fins. A spacer is formed on the fins and gate structure, and an insulating material is formed in openings between the spacers. The spacers adjacent to the fins are removed, and a semiconductor material is selectively grown on the fins to fill spacer gaps and to merge upper portions of fins.

Figure 1A:
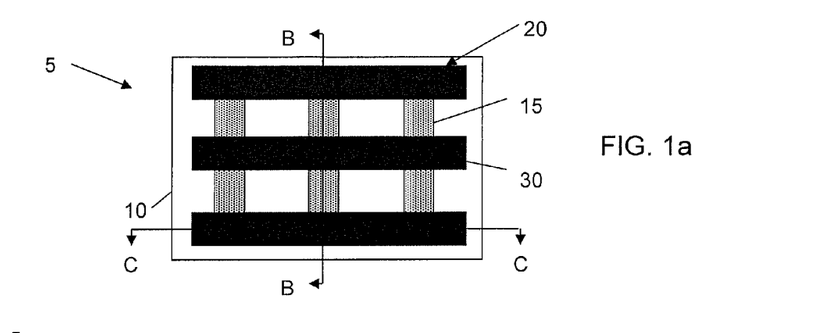
FIGS. 1a-1c show different views of a starting structure and respective processing steps in accordance with aspects of the present invention.
Figure 1B:
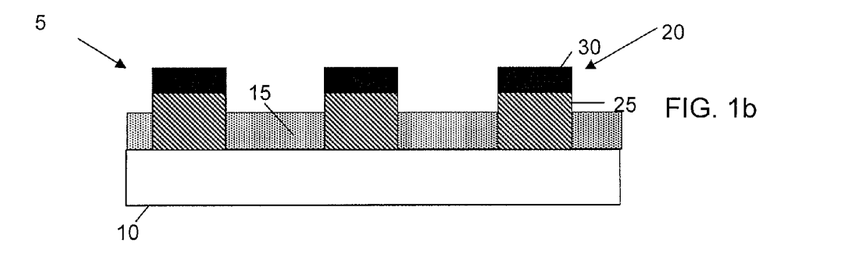
Figure 1C:
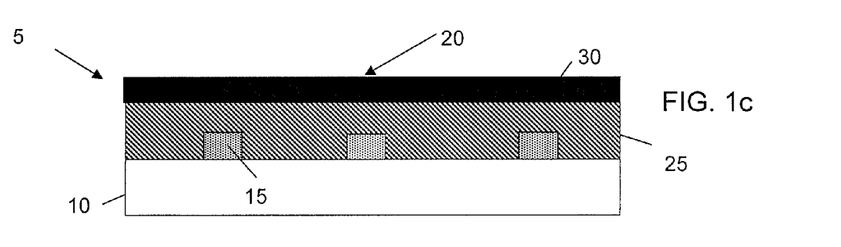

FIGS. 1a-1c show different views of a starting structure and respective processing steps in accordance with aspects of the present invention. More specifically, FIG. 1a shows a top view of the structure 10; whereas, FIG. 1b shows a cross-sectional view of the structure along line B-B of FIG. 1a and FIG. 1c shows a cross-sectional view of the structure along line C-C of FIG. 1a. It should be understood by those of skill in the art that the process of manufacturing the low-capacitance FET of the present invention and other passive and active components can be manufactured in a number of ways using a number of different tools. In general, though, the methodologies and tools are adopted from integrated circuit (IC) technology to form the structures with specific dimensions. For example, the structures of the present invention, e.g., low-capacitance FET, spacers, dielectric materials, etc., are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

More specifically, as shown in FIGS. 1a-1c, the structure 5 of the present invention includes a substrate 10. In embodiments, the substrate 10 can be any layer of a device, composed of an oxide or other insulator material known to those of skill in the art. As should be understood by those of skill in the art, the substrate 10 can be implemented in either an SOI wafer or BULK implementation, as examples. The constituent materials of the SOI wafer or BULK implementation may be selected based on the desired end use application of the semiconductor device. For example, the insulation layer, e.g., BOX, may be composed of oxide, such as $SiO_2$. Moreover, the active semiconductor layer can be comprised of various semiconductor materials, such as, for example, Si, SiGe, SiC, SiGeC, etc. The SOI wafer may be fabricated by conventional processes including, but not limited to, oxygen implantation (e.g., SIMOX), wafer bonding, etc.

Still referring to FIGS. 1a-1c, a plurality of fins 15 are formed on the substrate 10. In embodiments, the fins 15 are a plurality of parallel fins formed from semiconductor material such as SiGi or Si, as examples. The fins 15 can have a thickness ranging from about 5 nm to about 20 nm. In embodiments, the fins 15 can also have a height ranging from about 7 nm to about 40 nm. It should be understood by those of skill in the art that other dimensions are also contemplated by the present invention. The fabrication processes for forming the fins 15 can be, for example, conventional lithography and etching process, including sidewall image transfer processes known to those of skill in the art such that no further explanation is required for an understanding of the present invention.

FIGS. 1a-1c further show dummy gate stacks 20 formed on the substrate 10 and intersecting the adjacent fins 15. In embodiments, the dummy gate stacks 20 comprise dummy gate material 25 such as $B_4N_3$; although other materials are also contemplated by the present invention, which can be selective to etching processes of other materials. For example, the dummy gate material can be poly material. A cap layer 30 is formed on the dummy gate material 25. In embodiments, the cap layer 30 is $Si_3N_4$ or $SiO_2$. In embodiments, the cap layer 30 and dummy gate material 25 are different materials so as to permit selective etching of the dummy gate material 25 in later processing steps. In further embodiments, the cap layer can be eliminated and, in such an embodiment, the dummy gate material can remain, for example, $B_4N_3$.

In embodiments, the dummy gate stacks 20 can be formed by conventional deposition, lithography and etching steps. By way of illustrative example, the dummy gate material 25 and the cap layer 30 can be deposited on the structure, e.g., on the substrate 10 and fins 15, using conventional deposition processes. For example, the dummy gate material 25 and the cap layer 30 can be deposited using atomic layer deposition (ALD), chemical vapor deposition (CVD), plasma enhanced CVD (PECVD), amongst other deposition methods. Thereafter, the top of the structure, e.g., cap layer 30, is planarized using conventional chemical mechanical polishing (CMP). The gate material 25 and the cap layer 30 then undergo patterning using conventional lithography and etching processes, known to those of skill in the art.

Figure 1D:
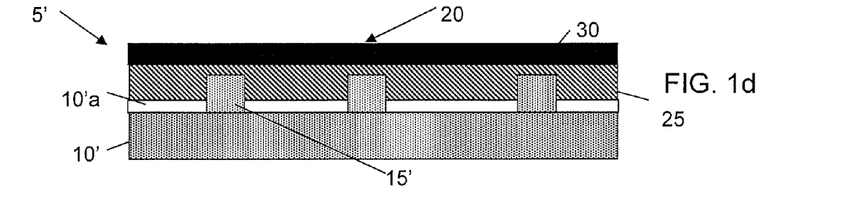
FIG. 1d shows a cross sectional view of another starting structure and respective processing steps in accordance with aspects of the present invention.

FIG. 1d shows a cross-sectional view of another starting structure and respective processing steps in accordance with aspects of the present invention. More specifically, FIG. 1d shows a cross-sectional view similar to that of FIG. 1c, but in a BULK implementation. In embodiments, the BULK implementation 5' includes fins 15' formed from the BULK substrate 10', using conventional etching processes. In embodiments, the insulator layer 10'a can be formed over the BULK substrate 10' and fins 15', and then etched back to form the structure of FIG. 1d. The insulator layer 10'a can be any insulator layer such as an oxide. As thus shown in FIG. 1d, the insulator layer 10'a is formed about the fins 15', and the fins 15' are in contact with the substrate 10'. In this way, a sub-fin region extends below the channel fin, down through the isolation oxide and in contact with the substrate 10' to form the entire fin (channel fin plus sub-fin).

In embodiments, the fins 15' can be formed through conventional lithography and etching processes. For example, a hardmask, e.g., SiN, can be formed on the substrate 10' and through conventional etching processes, the BULK substrate 10' can be etched, e.g., using a RIE process, to form the fins 15' (with the hardmask). Thereafter, the insulator layer 10'a can be blanket deposited on the substrate 10' and fins 15' using conventional blanket deposition processes. In embodiments, the insulator layer 10'a can be deposited to a height above the hardmask. The insulator layer 10'a can then be planarized, e.g., using CMP processes, to the hardmask. The insulator layer 10'a is then selectively etched using a directional etchant process, to a level below the fins 15'. The hardmask can then be selectively removed using a selective etchant. The processes can then continue as noted herein, for either an SOI implementation or a BULK implementation.

Figure 2A:
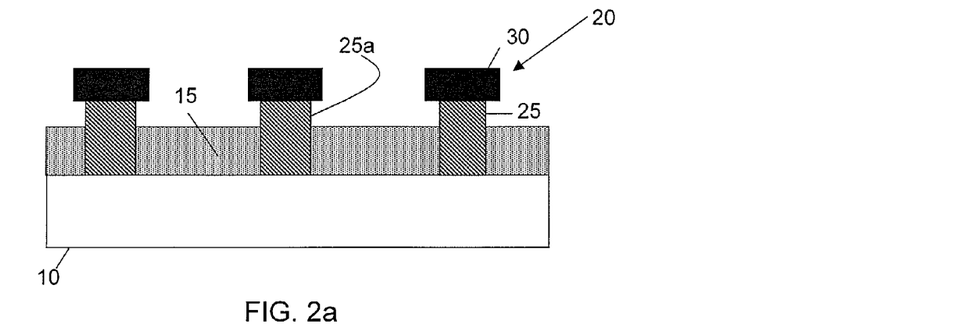
FIGS. 2a and 2b show additional cross-sectional views of the structure and respective processing steps in accordance with aspects of the present invention.
Figure 2B:
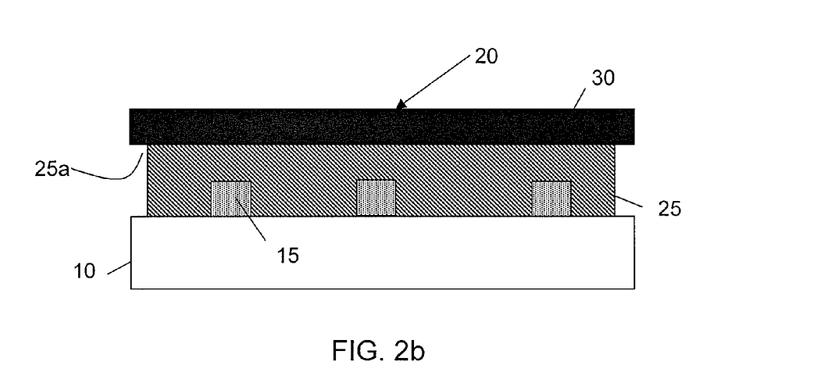

FIGS. 2a and 2b show additional cross-sectional views of the structure and respective processing steps in accordance with aspects of the present invention. Specifically, in FIGS. 2a and 2b, the dummy gate stack 20 undergoes etch back processes to form an overhang 25a. More specifically, dummy gate material 25 undergoes a selective etching, e.g., isotropic etching that is selective to the dummy gate material 25, to form an overhang 25a of the cap layer 30. In embodiments, the etching is selective to $B_4N_3$. In embodiments, the overhang 25a is formed by recessing the dummy gate material 25, around its perimeter. The recess or overhang 25a is about 2 nm to about 10 nm; although other dimensions are also contemplated by the present invention.

Figure 3A:
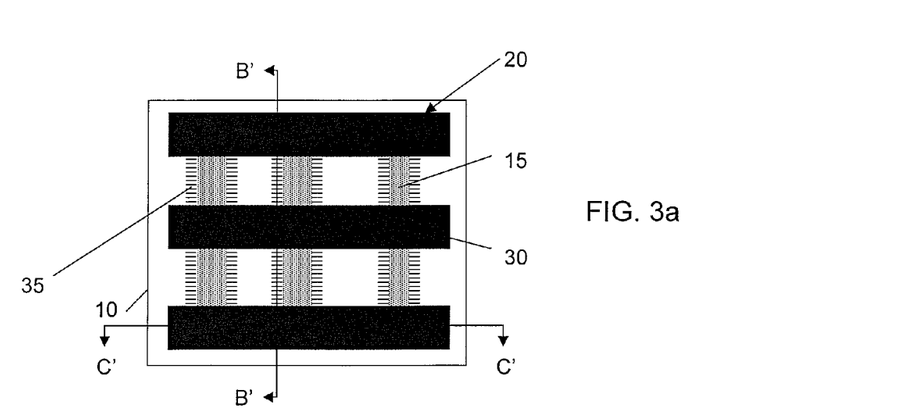
FIGS. 3a-3c show additional views of the structure and respective processing steps in accordance with aspects of the present invention.
Figure 3B:
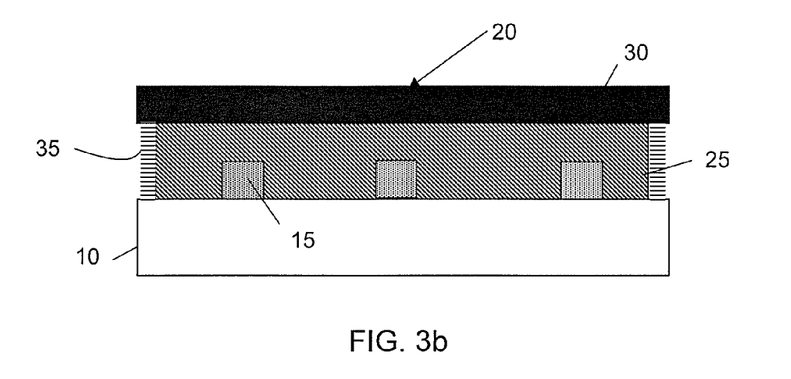
Figure 3C:
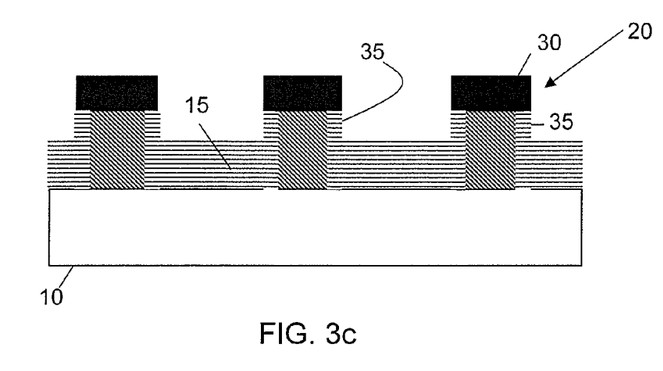

FIGS. 3a-3c show additional views of a structure and respective processing steps in accordance with aspects of the present invention. More specifically, FIG. 3a shows a top view of the structure; whereas, FIG. 3b shows a cross-sectional view of the structure along line B'-B' of FIG. 3a and FIG. 3c shows a cross-sectional view of the structure along line C'-C' of FIG. 3a. In FIGS. 3a-3c, a spacer material 35 is blanket deposited on the dummy gate material 25, under the overhang 25a, on the cap layer 30 and other exposed regions. In embodiments, the spacer material 35 is deposited to a depth of about 2 nm to about 10 nm in order to fill the recess formed by the overhang of the cap layer 30. The spacer material 35 can be deposited using any conventional deposition methods as described herein, and can be composed of, for example, $Si_3N_4$ or $SiO_2$, noting that the spacer material 35 should be different than the cap layer 20. For example, in embodiments, the cap layer 20 can be $Si_3N_4$ and the spacer material 35 can be $SiO_2$ or vice versa. In this way, the spacer material 35 can be selectively removed, without removing the cap layer 30.

The spacer material 35 then undergoes a vertical etching, e.g., anisotropic etching process, in order to remove the spacer material 35 from horizontal surfaces, e.g., top surfaces of the cap layer 30 and the fins 15, as well as exposed areas of the substrate 10. In this way, the spacer material 35 remains on vertical surfaces, including the sidewalls of the fins 15.

Figure 4:
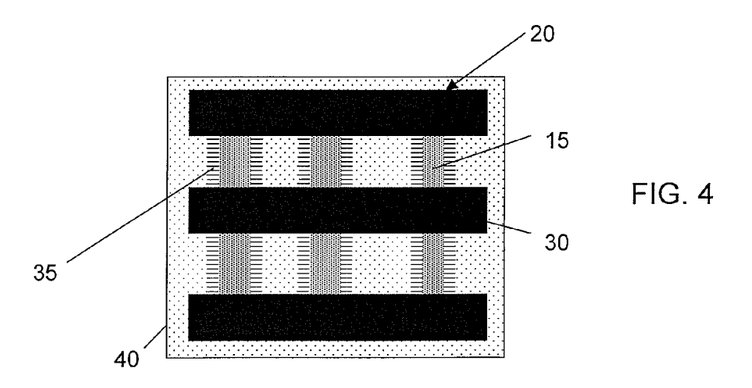
FIG. 4 shows a top view of the structure and respective processing steps in accordance with aspects of the present invention.

In FIG. 4, a dielectric material 40 is blanket deposited on the structures of the present invention. More specifically, the dielectric material 40 is blanket deposited on any exposed surfaces e.g., top surfaces of the cap layer 30 and the fins 15, as well as exposed areas of the substrate 10. In embodiments, the dielectric material 40 can be, for example, $Si_3N_4$ or $SiO_2$, noting that the dielectric material 40 should be different than the spacer material 35. For example, in embodiments, the dielectric material 40 can be $Si_3N_4$ and the spacer material 35 can be $SiO_2$ or vice versa. In this way, the dielectric material 40 can be selectively removed, without removing the spacer material 35. The dielectric material 40 can be planarized and selectively etched back to expose the upper portions of the spacer material 35 and fins 15. In embodiments, the dielectric material 40 is selectively etched back to below an upper surface of the fins 15, e.g., about 20% to 80% of the fins 15 (and spacer material 35 along the sidewalls of the fins 15) can be exposed. Advantageously, the dielectric material 40 on the underlying substrate 10 will reduce the capacitance of the finFET.

Figure 5A:
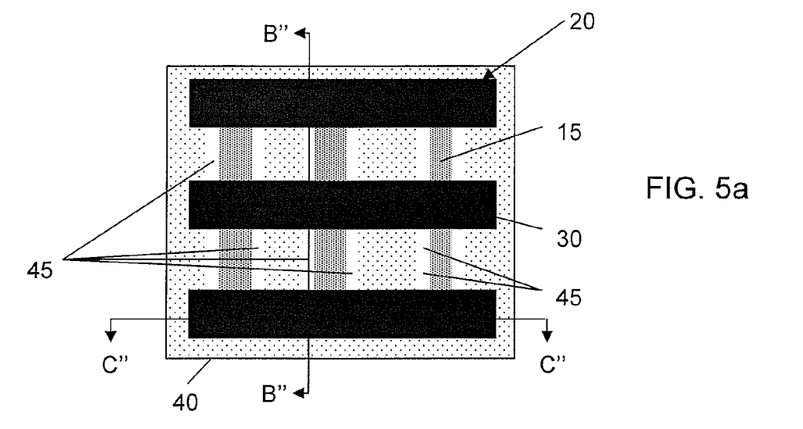
FIGS. 5a-5c show additional views of the structure and respective processing steps in accordance with aspects of the present invention.
Figure 5B:
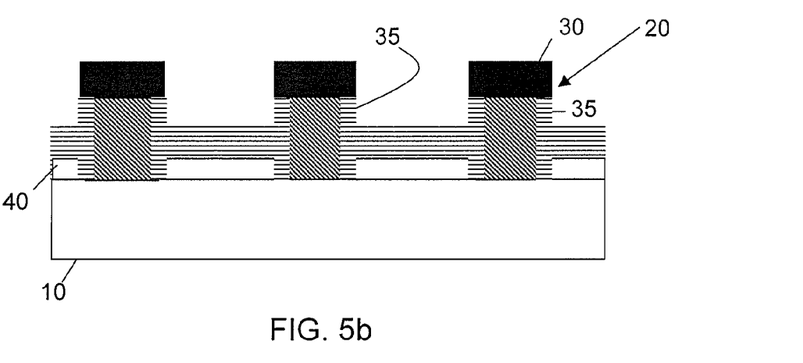
Figure 5C:
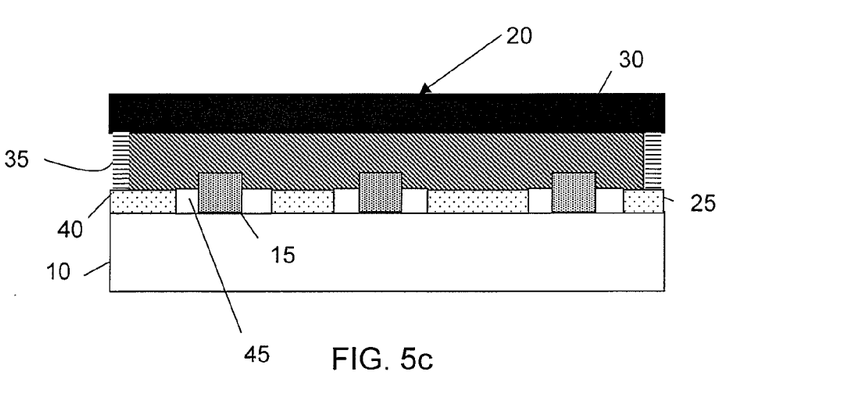

FIGS. 5a-5c show additional views of a structure and respective processing steps in accordance with aspects of the present invention. More specifically, FIG. 5a shows a top view of the structure; whereas, FIG. 5b shows a cross-sectional view of the structure along line B"-B" of FIG. 5a and FIG. 5c shows a cross-sectional view of the structure along line C"-C" of FIG. 5a. In FIGS. 5a-5c, the exposed spacer material on the sides of the fins 15 are selectively removed, forming a gap 45 between the dielectric material 40 and the fins 15. The gap formation will expose the underlying substrate 10, adjacent to the fins 15. In embodiments, the removal process is a selective anisotropic etching process, e.g., vertical etching process. The gap 45 is about 2 nm to about 10 nm, depending on the thickness of the spacer material 35. As should be understood by those of skill in the art, the spacer material 35 will be protected on the sides of the dummy gate structure 20 by the overhang of the cap layer 30.

Figure 6A:
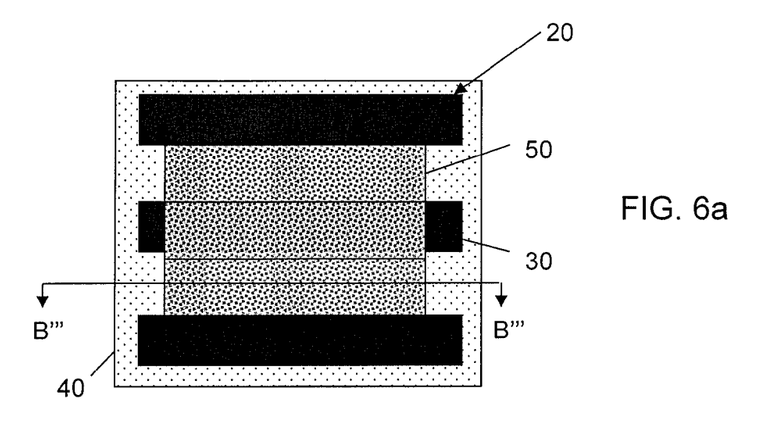
FIGS. 6a-6b show additional views of the structure and respective processing steps in accordance with aspects of the present invention.
Figure 6B:
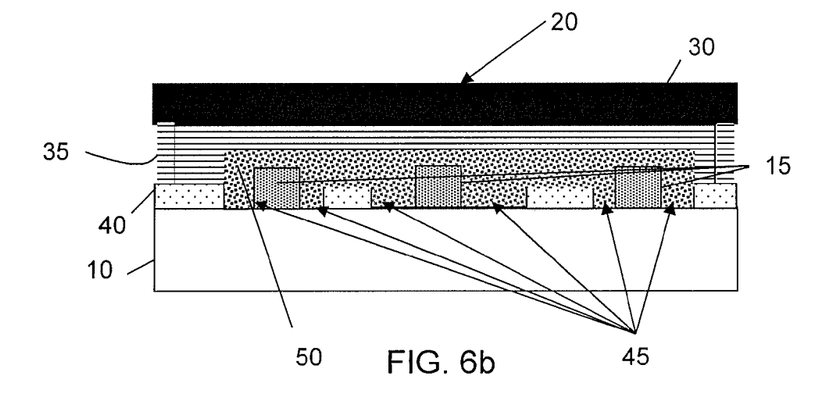

FIGS. 6a-6b show additional views of a structure and respective processing steps in accordance with aspects of the present invention. More specifically, FIG. 6a shows a top view of the structure; whereas, FIG. 6b shows a cross-sectional view of the structure along line B"-B'" of FIG. 6a. In FIGS. 6a-6b, semiconductor material 50 is epitaxially grown within the gaps 45 to partially or fully merge the exposed portions of the fins 15. In embodiments, the semiconductor material 50 can be, for example, Si, SiGe or SiC, amongst other known materials. The semiconductor material 50 is a conducting semiconductor strap surrounding at least three sides of a portion of the fins 15, which is interrupted between fins in a lower region by the insulating region, e.g., dielectric material 40. In embodiments, the semiconductor material 50 can be grown to extend on the fins 15, without fully merging the fins 15. Advantageously, the underlying dielectric material 40 will reduce the capacitance of the finFET. Back end of the line (BEOL) processes are then provided including, doping the semiconductor material to form source and drain regions, in addition to an annealing and silicide processes to form contacts.

Figure 7:
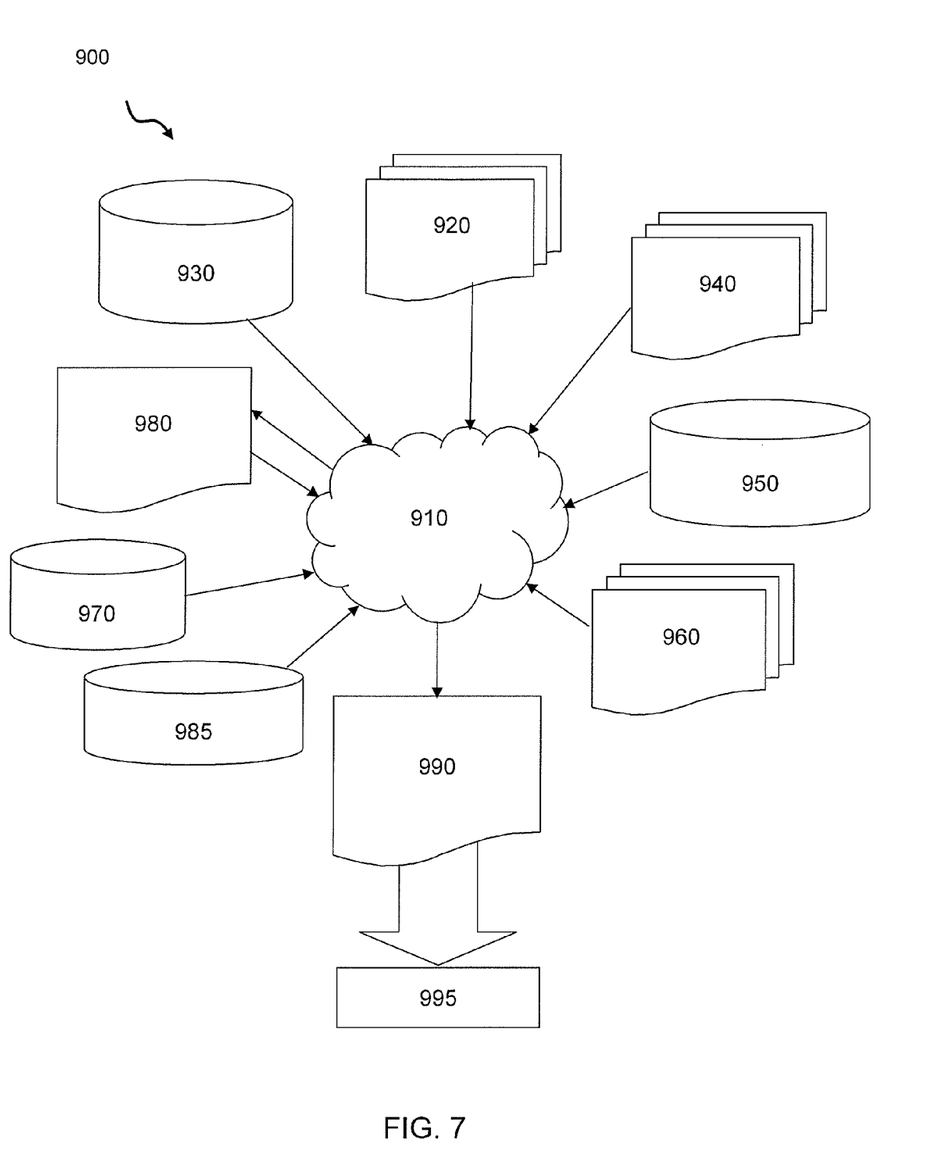
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a-1c, 2a, 2b, 3a-3c, 4, 5a-5c, 6a and 6b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-1c, 2a, 2b, 3a-3c, 4, 5a-5c, 6a and 6b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-1c, 2a, 2b, 3a-3c, 4, 5a-5c, 6a and 6b to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-1c, 2a, 2b, 3a-3c, 4, 5a-5c, 6a and 6b. In one embodiment, design structure 990 may comprise a compiled, executable HDL simulation model that functionally simulates the devices shown in FIGS. 1a-1c, 2a, 2b, 3a-3c, 4, 5a-5c, 6a and 6b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-1c, 2a, 2b, 3a-3c, 4, 5a-5c, 6a and 6b. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a plurality of fins on a substrate;
   forming at least one dummy gate structure intersecting the plurality of fins;
   forming a spacer material on sidewalls of the plurality of fins;
   forming a gap between the sidewalls of the plurality of fins and an insulator material formed on sides of the spacer material between adjacent fins of the plurality of fins, by selectively removing the spacer material located between the insulator material and the sidewalls of each respective fin of the plurality of fins, thereby exposing portions of the substrate; and
   merging the fins together with semiconductor material formed within the gaps and over the insulator material.

2. The method of claim 1, wherein the merging comprising epitaxially growing the semiconductor material on the exposed portions of the substrate and on the plurality of the fins.

3. The method of claim 2, wherein the semiconductor material is one of Si, SiGe and SiC.

4. The method of claim 1, wherein the forming of the plurality of fins comprises depositing semiconductor material on the substrate and patterning the semiconductor material using sidewall image transfer processes.

5. The method of claim 1, wherein the semiconductor material is formed over the insulator material between adjacent gaps.

6. The method of claim 5, wherein the merging is a partial merging of the fins.

7. The method of claim 5, wherein the merging is a full merging of the fins.

8. A method, comprising:
   forming a plurality of fins on a substrate;
   forming at least one dummy gate structure intersecting the plurality of fins;
   forming a gap between sidewalls of the fins and an insulator material, which exposes portions of the substrate; and
   merging the fins together with semiconductor material formed within the gaps and over the insulator material;
   forming an overhang of the at least one dummy gate structure by recessing material under a cap layer of the at least one dummy gate structure;
   forming sidewall material under the overhang and on sidewalls of the plurality of fins;
   forming the insulator material adjacent to the sidewall material, which is recessed below a top surface of the plurality of fins and the sidewall material; and
   removing the sidewall material adjacent to the plurality of fins to form the gap and expose the underlying substrate.

9. The method of claim 8, wherein the cap layer is different from the recessed sidewall material and the material.

10. The method of claim 9, wherein the cap layer protects the sidewall material under the overhang, during formation of the gap which comprising anisotropic etching of the sidewall material adjacent to the plurality of fins.

11. The method of claim 9, wherein:
    the material comprises $B_4N_3$;
    the cap layer comprises one of $Si_3N_4$ and $SiO_2$; and
    the sidewall material comprises one of $SiO_2$ and $Si_3N_4$, respectively.

12. A method, comprising:
    forming a plurality of fins on a substrate;
    forming at least one dummy gate structure intersecting the plurality of fins, the at least one dummy gate structure comprising a first material and a second material forming an overhang over the first material;
    forming sidewall material on sides of the plurality of fins and under the overhang;
    forming a dielectric material on exposed portions of the substrate and adjacent to the sidewall material on sides of the plurality of fins;
    removing the sidewall material on sides of the plurality of fins to form a gap between each of the plurality of fins and portions of the dielectric material; and
    merging the fins together with semiconductor material formed within the gaps.

13. The method of claim 12, wherein the removing of the sidewall material exposes portions of the substrate.

14. The method of claim 13, wherein the merging of the fins comprising epitaxially growing the semiconductor material on the exposed portions of the substrate, on the plurality of the fins and over the dielectric material.

15. The method of claim 14, wherein the semiconductor material is one of Si, SiGe and SiC.

16. The method of claim 14, wherein the merging is a partial merging of the fins.

17. The method of claim 14, wherein the merging is a full merging of the fins.

18. The method of claim 12, wherein the overhang protects the sidewall material formed on the first material, during the removing step.

19. The method of claim 12, wherein:
    the second material and the sidewall material are different materials;
    the second material and the first material are different materials;
    the dielectric material is etched back to below a top surface of the plurality of fins and the sidewall material; and
    the removing of the sidewall material is an anisotropic etching process selective to the sidewall material.

* * * * *